US009355196B2

(12) United States Patent
Muraoka et al.

(10) Patent No.: US 9,355,196 B2
(45) Date of Patent: May 31, 2016

(54) MODEL ESTIMATION DEVICE AND MODEL ESTIMATION METHOD

(71) Applicant: NEC Corporation, Tokyo (JP)

(72) Inventors: Yusuke Muraoka, Tokyo (JP); Ryohei Fujimaki, Tokyo (JP)

(73) Assignee: NEC Corporation, Tokyo (JP)

( * ) Notice: Subject to any disclaimer, the term of this patent is extended or adjusted under 35 U.S.C. 154(b) by 281 days.

(21) Appl. No.: 14/066,281

(22) Filed: Oct. 29, 2013

(65) Prior Publication Data

US 2015/0120254 A1 Apr. 30, 2015

(51) Int. Cl.
*G06F 17/50* (2006.01)

(52) U.S. Cl.
CPC .................................... *G06F 17/50* (2013.01)

(58) Field of Classification Search
CPC ....... G06N 7/005; G06N 99/005; G06N 5/04; G06N 5/02; G06N 5/048; G06F 17/50; G06F 17/16
USPC .................................... 706/12, 46, 52; 703/2
See application file for complete search history.

(56) References Cited

U.S. PATENT DOCUMENTS 7,480,640 B1* 1/2009 Elad ...................... G06Q 10/10 706/14
7,499,897 B2* 3/2009 Pinto ...................... G06Q 30/02 706/11
2012/0323834 A1* 12/2012 Fujimaki .................. G06N 5/02 706/46
2013/0211801 A1* 8/2013 Fujimaki ................ G06F 17/18 703/2
2013/0325782 A1* 12/2013 Fujimaki ................ G06N 7/005 706/46
2014/0222741 A1* 8/2014 Eto ........................ G06N 7/005 706/46
2014/0343903 A1* 11/2014 Fujimaki ................ G06F 17/18 703/2
2014/0344183 A1* 11/2014 Fujimaki ............. G06Q 10/067 705/348
2015/0088789 A1* 3/2015 Motohashi ........... G06N 99/005 706/12

OTHER PUBLICATIONS

Blei D. et al., "Variational Inference for Dirichlet Process Mixtures", Bayesian Analysis, No. 1, pp. 121-144, 2006.*
Fei-Fei L. et al., "A Bayesian Hierarchical Model for Learning Natural Scene Categories", Computer Vision and Pattern Recognition, 2005. CVPR 2005. IEE Computer Society Conference. vol. 2, IEEE, 2005.*

(Continued)

*Primary Examiner* — Stanley K Hill
*Assistant Examiner* — Dave Misir
(74) *Attorney, Agent, or Firm* — Wilmer Cutler Pickering Hale and Dorr LLP

(57) ABSTRACT

A model estimation device includes: a data input unit 101; a state number setting unit; an initialization unit; a latent variable variational probability computation unit which computes a variational probability of a latent variable so as to maximize a lower bound of a model posterior probability limited in degree of freedom; a component optimization unit which estimates an optimal type of each component and a parameter thereof so as to maximize the lower bound of the model posterior probability limited in degree of freedom and separated for each component of a latent variable model; a free parameter selection variable computation unit which computes the free parameter selection variable; an optimality determination unit which determines whether or not to continue the maximization of the lower bound of the model posterior probability; and a result output unit.

9 Claims, 6 Drawing Sheets

(56) References Cited

OTHER PUBLICATIONS

Fujimaki R. et al., “Factorized Asymptotic Bayesian Inference for Mixture Modeling”, Appearing in Proceedings of the 15th International Conference on Artificial Intelligence and Statistics (AISTATS) 2012, La Palma, Canary Islands. vol. XX of JMLR: W&CP XX.*

Blei, David M., Andrew Y. Ng, and Michael I. Jordan, Latent Dirichlet Allocation, the Journal of Machine Learning Research 3 (2003): pp. 993-1022.

Teh, Yee Whye, et al., “Sharing Clusters Among Related Groups: Hierarchical Dirichlet Processes,” the Journal of the American Statistical Association 101.476 (2006), 8 pages.

* cited by examiner

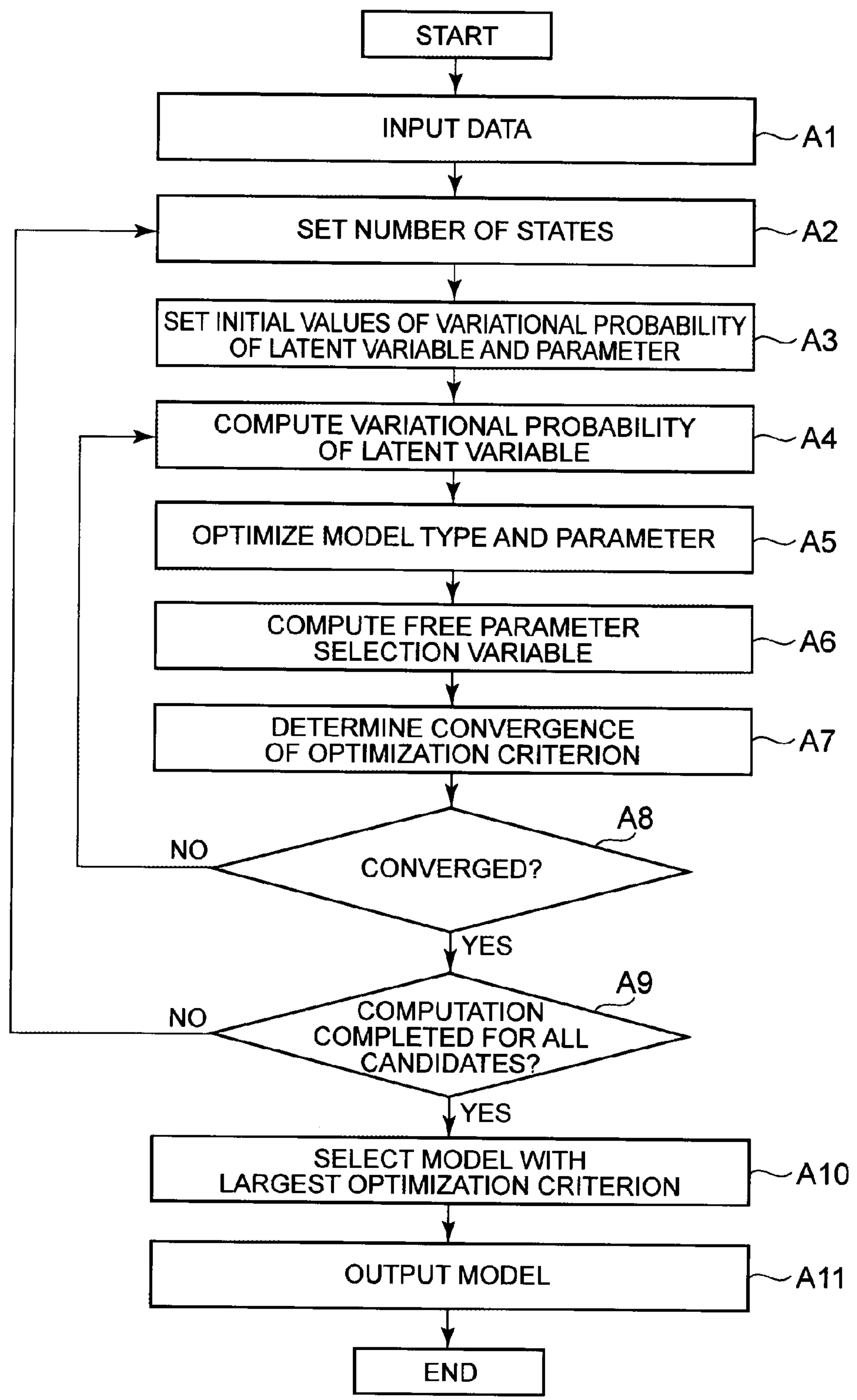
FIG. 2
START
INPUT DATA
A1
SET NUMBER OF STATES
A2
SET INITIAL VALUES OF VARIATIONAL PROBABILITY OF LATENT VARIABLE AND PARAMETER
A3
COMPUTE VARIATIONAL PROBABILITY OF LATENT VARIABLE
A4
OPTIMIZE MODEL TYPE AND PARAMETER
A5
COMPUTE FREE PARAMETER SELECTION VARIABLE
A6
DETERMINE CONVERGENCE OF OPTIMIZATION CRITERION
A7
CONVERGED?
A8
NO
YES
COMPUTATION COMPLETED FOR ALL CANDIDATES?
A9
NO
YES
SELECT MODEL WITH LARGEST OPTIMIZATION CRITERION
A10
OUTPUT MODEL
A11
END

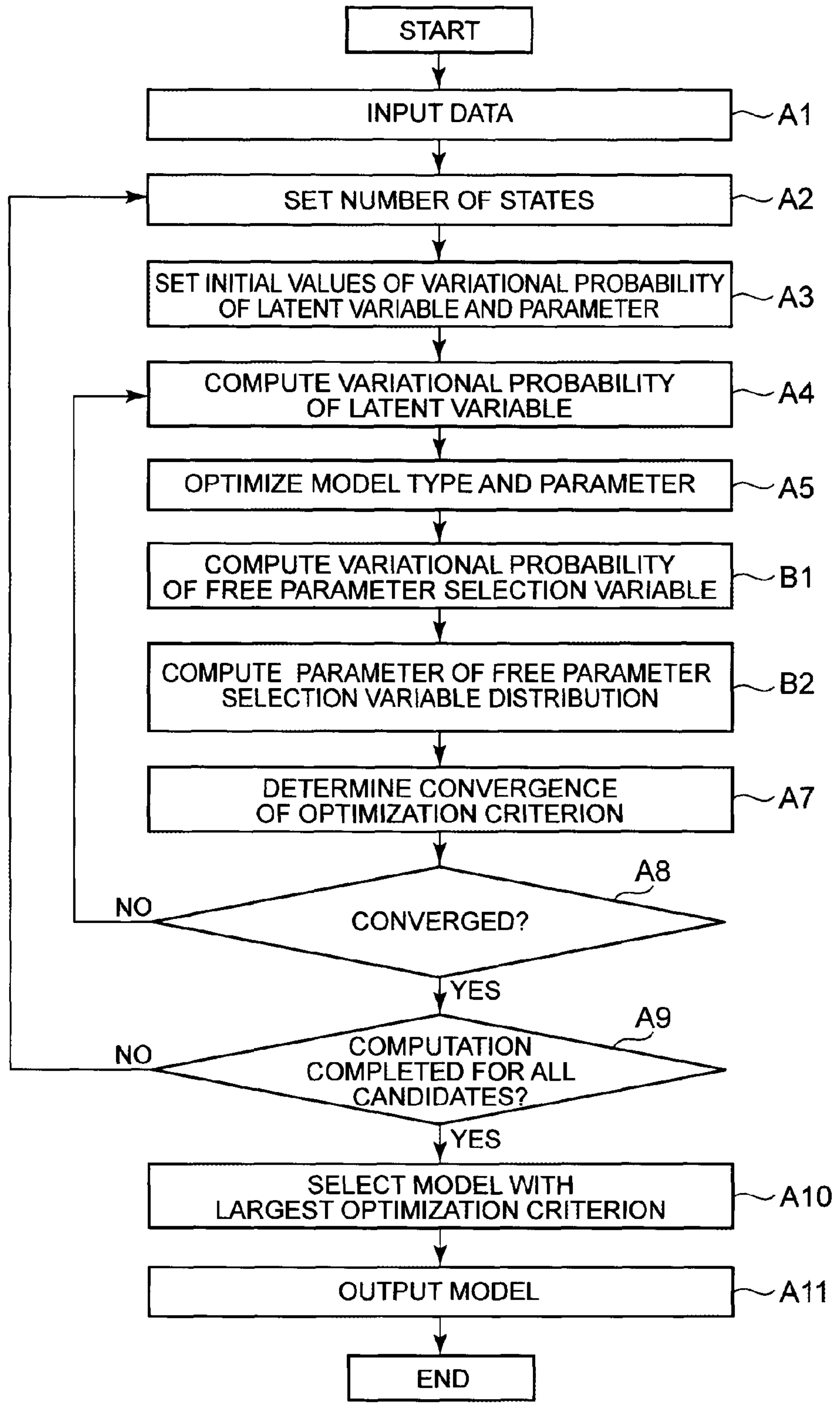
FIG. 4
START
INPUT DATA
A1
SET NUMBER OF STATES
A2
SET INITIAL VALUES OF VARIATIONAL PROBABILITY OF LATENT VARIABLE AND PARAMETER
A3
COMPUTE VARIATIONAL PROBABILITY OF LATENT VARIABLE
A4
OPTIMIZE MODEL TYPE AND PARAMETER
A5
COMPUTE VARIATIONAL PROBABILITY OF FREE PARAMETER SELECTION VARIABLE
B1
COMPUTE PARAMETER OF FREE PARAMETER SELECTION VARIABLE DISTRIBUTION
B2
DETERMINE CONVERGENCE OF OPTIMIZATION CRITERION
A7
CONVERGED?
A8
NO
YES
COMPUTATION COMPLETED FOR ALL CANDIDATES?
A9
NO
YES
SELECT MODEL WITH LARGEST OPTIMIZATION CRITERION
A10
OUTPUT MODEL
A11
END

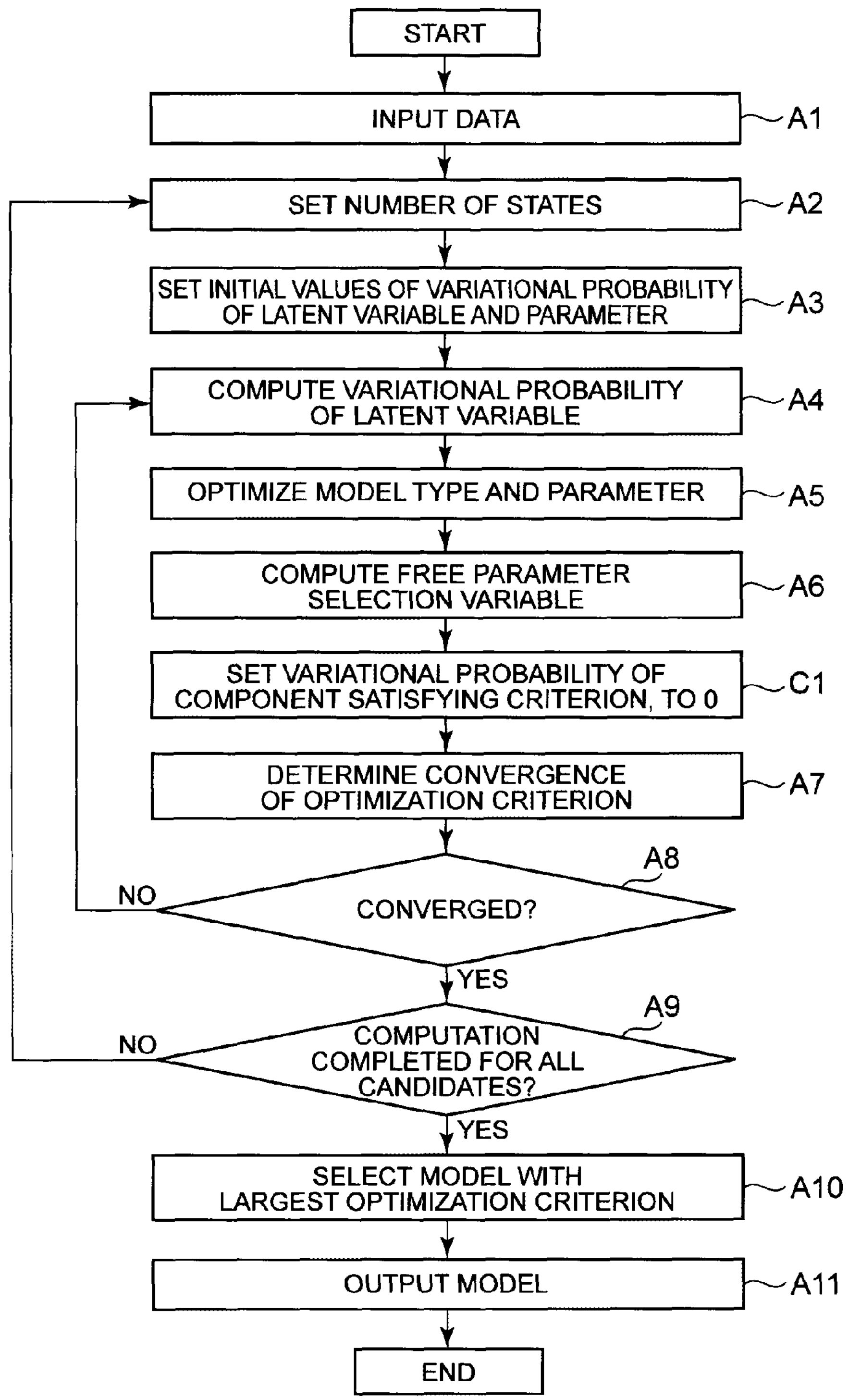
FIG. 6
START
INPUT DATA
A1
SET NUMBER OF STATES
A2
SET INITIAL VALUES OF VARIATIONAL PROBABILITY OF LATENT VARIABLE AND PARAMETER
A3
COMPUTE VARIATIONAL PROBABILITY OF LATENT VARIABLE
A4
OPTIMIZE MODEL TYPE AND PARAMETER
A5
COMPUTE FREE PARAMETER SELECTION VARIABLE
A6
SET VARIATIONAL PROBABILITY OF COMPONENT SATISFYING CRITERION, TO 0
C1
DETERMINE CONVERGENCE OF OPTIMIZATION CRITERION
A7
A8
NO
CONVERGED?
YES
A9
NO
COMPUTATION COMPLETED FOR ALL CANDIDATES?
YES
SELECT MODEL WITH LARGEST OPTIMIZATION CRITERION
A10
OUTPUT MODEL
A11
END

MODEL ESTIMATION DEVICE AND MODEL ESTIMATION METHOD

FIELD OF THE INVENTION

The present invention relates to a model estimation device and model estimation method for estimating hierarchical latent variable models for multivariate data.

BACKGROUND ART

In ordinary documents, for example, documents with topics in the same field are similar in description as compared with documents with topics in different fields. Moreover, retail stores with the same locational condition are similar in sales of specific products. The locational condition is information of, for instance, whether the store is located in a business district, near a station, or in a suburb. Thus, in many types of data, an actually observed variable (the above-mentioned "description" or "sales") changes according to the value of another factor that is unobservable (the above-mentioned "topic" or "store location").

Estimating unobservable variables in such data is applicable to industrially important situations. As an example, by estimating documents with the same topic, a user can specify a document group that meets the search intention and a document group that does not meet the search intention from among searched-for documents, thus obtaining desired documents more quickly. As another example, by estimating stores with the same store sales factor, a user can specify in which store a product sold well in a specific store should be introduced to achieve good sales, upon deciding the range of products in each store.

Mixture distribution models are typically employed to estimate such unobservable factors. A mixture distribution model is a model representing that an observed variable is created from a distribution obtained by a superposition of a plurality of distributions (components). A mixture distribution model is a model in which components are selected according to an unobservable factor and an observed variable is created from the components.

In addition, models hierarchically using mixture distribution parameters are employed to represent situations where an observed variable creation factor is similar for each set of specific samples (e.g. a similar factor for documents, a similar factor for stores). For instance, models called "Latent Dirichlet Allocation (LDA)" described in Non Patent Literature (NPL) 1 are used in the case of natural sentences.

In NPL 1, each document is represented by words (observed variables), the words in each document have latent states, and a parameter that is set for each document defines latent variable occurrence probabilities. Further, in NPL 1, how these parameters are likely to occur is indicated using a parameter common to the whole documents. In NPL 1, the tendencies of topics depending on documents are expressed by creating such models.

In NPL 1, there is a problem that the parameters and the latent states cannot be estimated unless the number of latent states is set beforehand. To solve this problem, in NPL 2, the estimation is performed by assuming models in which the number of latent states and the parameters are created by a Dirichlet process. A nonparametric Bayesian method using a Dirichlet process, however, has a problem of extremely high computational complexity.

CITATION LIST

Non Patent Literature

NPL 1: Blei, David M., Andrew Y. Ng, and Michael I. Jordan "Latent dirichlet allocation" the Journal of Machine Learning Research 3 (2003): 993-1022.

NPL 2: Teh, Yee Whye, et al. "Hierarchical dirichlet processes" Journal of the American Statistical Association 101.476 (2006).

SUMMARY OF THE INVENTION

There is also a method of determining the number of latent states by approximating a complete marginal likelihood function and maximizing its lower bound (lower limit) for mixture models which are a typical example of latent variable models. This method can reduce the computational complexity as compared with the nonparametric Bayesian method, and estimate the number of latent states, the latent states, and the parameters at high speed.

However, this method is not applicable to models in which the dimensionality of parameters of components is large, for the following reason. In the method, an integral in parameters is approximated by Laplace approximation in order to approximate the complete marginal likelihood function. In models in which the dimensionality of parameters is large, however, a large approximation error occurs. Components in the LDA are multinomial distributions for creating words. Since each word is assigned a probability, the dimensionality of components corresponds to the number of types of words, which is very large.

An exemplary object of the present invention is to provide a model estimation device and model estimation method that can estimate the number of latent states, the latent states, and the parameters at high speed without losing theoretical validity, even for latent variable models in which the dimensionality of parameters of components is large.

A model estimation device according to an exemplary aspect of the present invention includes: a data input unit which acquires observed value data subjected to estimation of a latent variable model, a type of each component constituting the latent variable model, and a state number candidate set of the latent variable model; a state number setting unit which sets an element for which computation has not been completed yet in the state number candidate set, as the number of states; an initialization unit which sets initial values of a variational probability of a latent variable, a parameter, the type of each component, and a free parameter selection variable; a latent variable variational probability computation unit which acquires the observed value data and the variational probability of the latent variable, the type of each component, the parameter, and the free parameter selection variable set by the initialization unit, and computes the variational probability of the latent variable so as to maximize a lower bound of a model posterior probability limited in degree of freedom by the free parameter selection variable; a component optimization unit which acquires the observed value data and the variational probability of the latent variable, the type of each component, the parameter, and the free parameter selection variable set by the initialization unit, and estimates an optimal type of each component and a parameter thereof by optimizing the type of each component and the parameter so as to maximize the lower bound of the model posterior probability limited in degree of freedom by the free parameter selection variable and separated for each component of the latent variable model; a free parameter selection variable computation unit which acquires the type of each component and the parameter thereof estimated by the component optimization unit and the variational probability of the latent variable computed by the latent variable variational probability computation unit, and computes the free parameter selection variable; an optimality determination unit which acquires the observed value data, the type of each component and the parameter thereof estimated by the component optimization unit, the variational probability of the latent variable computed by the latent variable variational probability computation unit, and the free parameter selection variable computed by the free parameter selection variable computation unit, and determining whether or not to continue the maximization of the lower bound of the model posterior probability limited in degree of freedom; and a result output unit which outputs the variational probability of the latent variable computed by the latent variable variational probability computation unit and the type of each component and the parameter thereof estimated by the component optimization unit.

A model estimation device according to an exemplary aspect of the present invention includes: a data input unit which acquires observed value data subjected to estimation of a latent variable model, a type of each component constituting the latent variable model, and a state number candidate set of the latent variable model; a state number setting unit which sets an element for which computation has not been completed yet in the state number candidate set, as the number of states; an initialization unit which set initial values of a variational probability of a latent variable, a parameter, the type of each component, a variational probability of a free parameter selection variable, and a parameter of a free parameter selection variable distribution; a latent variable variational probability computation unit which acquires the observed value data and the variational probability of the latent variable, the type of each component, the parameter, the free parameter selection variable, and the parameter of the free parameter selection variable distribution set by the initialization unit, and computes the variational probability of the latent variable so as to maximize a lower bound of a model posterior probability limited in degree of freedom by the free parameter selection variable; a component optimization unit which acquires the observed value data and the variational probability of the latent variable, the type of each component, the parameter, the free parameter selection variable, and the parameter of the free parameter selection variable distribution set by the initialization unit, and estimates an optimal type of each component and a parameter thereof by optimizing the type of each component and the parameter so as to maximize the lower bound of the model posterior probability limited in degree of freedom by the free parameter selection variable and separated for each component of the latent variable model; a free parameter selection variable computation unit which acquires the type of each component and the parameter thereof estimated by the component optimization unit and the variational probability of the latent variable computed by the latent variable variational probability computation unit, and computes the variational probability of the free parameter selection variable; a free parameter selection variable distribution optimization unit which acquires the variational probability of the free parameter selection variable computed by the free parameter selection variable computation unit, and computes the parameter of the free parameter selection variable distribution; an optimality determination unit which acquires the observed value data, the type of each component and the parameter thereof estimated by the component optimization unit, the variational probability of the latent variable computed by the latent variable variational probability computation unit, the variational probability of the free parameter selection variable computed by the free parameter selection variable computation unit, and the parameter of the free parameter selection variable distribution computed by the free parameter selection variable distribution optimization unit, and determines whether or not to continue the maximization of the lower bound of the model posterior probability limited in degree of freedom; and a result output unit which outputs the variational probability of the latent variable computed by the latent variable variational probability computation unit and the type of each component and the parameter thereof estimated by the component optimization unit.

A model estimation method according to an exemplary aspect of the present invention includes: acquiring observed value data subjected to estimation of a latent variable model, a type of each component constituting the latent variable model, and a state number candidate set of the latent variable model; setting an element for which computation has not been completed yet in the state number candidate set, as the number of states; setting initial values of a variational probability of a latent variable, a parameter, the type of each component, and a free parameter selection variable; acquiring the observed value data and the set variational probability of the latent variable, type of each component, parameter, and free parameter selection variable, and computing the variational probability of the latent variable so as to maximize a lower bound of a model posterior probability limited in degree of freedom by the free parameter selection variable; acquiring the observed value data and the set variational probability of the latent variable, type of each component, parameter, and free parameter selection variable, and estimating an optimal type of each component and a parameter thereof by optimizing the type of each component and the parameter so as to maximize the lower bound of the model posterior probability limited in degree of freedom by the free parameter selection variable and separated for each component of the latent variable model; acquiring the estimated type of each component and parameter thereof and the computed variational probability of the latent variable, and computing the free parameter selection variable; acquiring the observed value data, the estimated type of each component and parameter thereof, the computed variational probability of the latent variable, and the computed free parameter selection variable, and determining whether or not to continue the maximization of the lower bound of the model posterior probability limited in degree of freedom; and outputting the computed variational probability of the latent variable and the estimated type of each component and parameter thereof.

According to the present invention, it is possible to estimate the number of latent states, the latent states, and the parameters at high speed without losing theoretical validity, for latent variable models in which the dimensionality of the parameter of each component is large.

BRIEF DESCRIPTION OF THE DRAWINGS

FIG. 2 is a flowchart showing an operation of Exemplary Embodiment 1 of the model estimation device according to the present invention.

FIG. 4 is a flowchart showing an operation of Exemplary Embodiment 2 of the model estimation device according to the present invention.

FIG. 6 is a flowchart showing an operation of Exemplary Embodiment 3 of the model estimation device according to the present invention.

DESCRIPTION OF THE PREFERRED EMBODIMENTS

Figure 1:
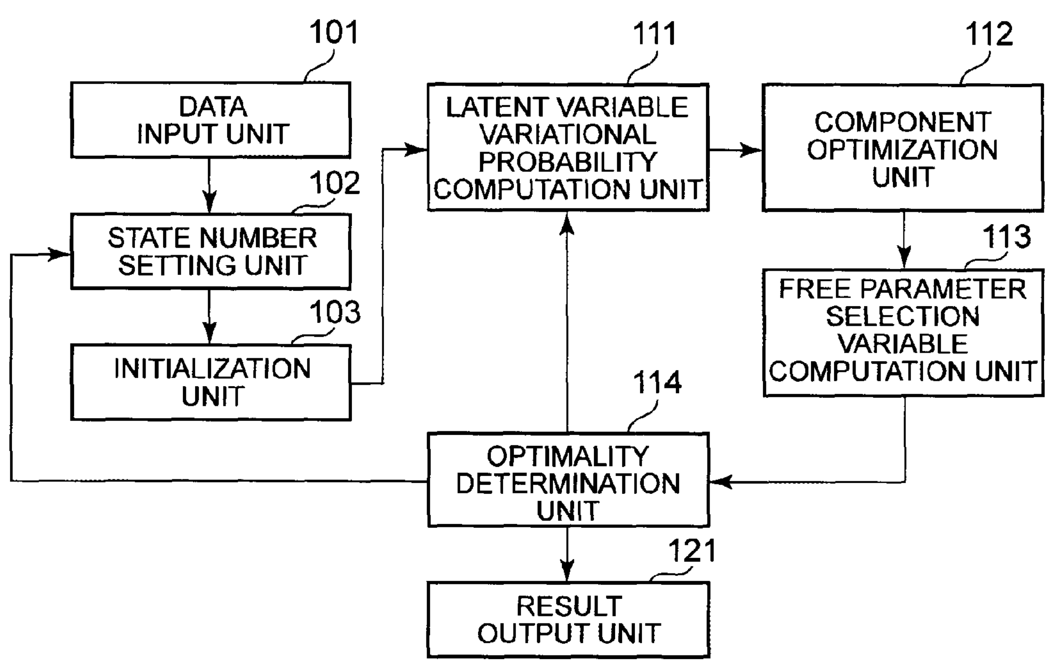
FIG. 1 is a block diagram showing a structure of Exemplary Embodiment 1 of a model estimation device according to the present invention.

The following describes exemplary embodiments of the present invention with reference to drawings.

Models to be estimated in each exemplary embodiment are described below. An observed variable $x_i$ is represented as in the following Expression (1).

$$x_i \in \{1, \ldots, N\} \quad (1)$$

A latent variable $z_i$ corresponding to the observed variable is represented as in the following Expression (2) (where K is the number of types of latent states).

$$z_i \in \{0,1\}^K \Sigma_k z_{i,k}=1 \quad (2)$$

Suppose the observed variable $x_i$ is created from a regular model that differs according to the value of the latent variable $z_i$. In this case, the observed variable $x_i$ is represented as in the following Expression (3).

$$x_i \sim P_k(x_i|\eta_{k\cdot}) \text{ if } z_{i,k}=1 \quad (3)$$

Several types of models are assumed for $P_k$ shown in Expression (3), where the types are denoted by H. For example, assuming that one model is selected from M models for each component, the component is represented by a matrix in which 1, . . . , K are associated with any of 1, . . . , M. The model estimation device in this exemplary embodiment has an exemplary object of realizing model selection with theoretical validity even in the case where the dimensionality of the parameter $\eta_k$ of the assumed model is large. It is assumed that the latent variable $z_i$ is created from a given regular model. In this case, $z_i$ is represented as in the following Expression (4).

$$z_i \sim P(z_i|\alpha) \quad (4)$$

The following describes a method for realizing model selection and parameter estimation for mixture models mentioned above. A new variable is introduced here. Let $\xi_{kj}$(free parameter selection variable) be a variable for determining, for the parameter $\eta_{kj}$ of the j-th dimension of each component, whether or not to include this parameter in the model parameter. If $\xi_{kj}=1$, the parameter is treated as the model parameter. If $\xi_{kj}=0$, the parameter is excluded from the model parameter and a given constant is assigned. To represent this, it is assumed that the parameter is rewritten by a free parameter selection variable. For example, in the case where the model is a multinomial distribution, the occurrence frequency of each dimension j is rewritten as in the following Expression (5). With the use of the form $\xi_{kj}\phi_{kj}$, $\phi_{kj}$ does not influence the model in the case where $\xi_{kj}=0$. $\phi_{kj}$ is a parameter of component k in j-th dimension.

$$p(x=j \mid \phi_{k\cdot}, \xi_{k\cdot}) = \frac{1+\xi_{kj}\phi_{kj}}{\sum_j (1+\xi_{kj}\phi_{kj})} \quad (5)$$

Note, however, that models to be estimated are not limited to mixture models, so long as they are latent variable models. In the following description, the variational probability of the latent variable is also simply referred to as "variational probability".

Exemplary Embodiment 1

The following describes a structure of a model estimation device in this exemplary embodiment. FIG. 1 is a block diagram showing the structure of Exemplary Embodiment 1 of the model estimation device. The model estimation device includes a data input unit 101, a state number setting unit 102, an initialization unit 103, a latent variable variational probability computation unit 111, a component optimization unit 112, a free parameter selection variable computation unit 113, an optimality determination unit 114, and a result output unit 121.

The structure shown in FIG. 1 is realized, for example, by an information processing device such as a CPU (Central Processing Unit) operating according to a program or hardware designed to perform specific computation and the like. The program is stored in a computer-readable non-transitory information storage medium.

In this exemplary embodiment, the model parameter and the variational probability of the latent variable are computed so as to maximize the lower bound of the model posterior probability limited in degree of freedom. The model posterior probability limited in degree of freedom is p(x|ξ, M) given in the following Expression (6).

$$p(x \mid \xi, M) = \sum_z \int p(x \mid z, \phi, \xi)p(z \mid \alpha)p(\phi, \alpha \mid M)d\phi d\alpha \quad (6)$$

Alternatively, in Exemplary Embodiment 2 described later, a distribution is assumed for ξ as shown in the following Expression (7), and the model posterior probability in this case is referred to as "model posterior probability limited in degree of freedom".

$$p(x \mid M) = \sum_\xi \sum_z \int p(x \mid z, \phi, \xi)p(z \mid \alpha)p(\xi \mid \beta)p(\phi, \alpha, \beta \mid M)d\phi d\alpha d\beta \quad (7)$$

The data input unit 101 acquires observed value data subjected to estimation of a mixture model, a type (type candidate) and parameter of each component constituting the mixture model, a set (state number candidate set) of candidates (candidate values) for the number of states (the number of latent states) selected by the latent variable, and a threshold for convergence determination. Hereafter, the type of each component constituting the mixture model is simply referred to as "component type".

The state number setting unit 102 sets a number of an element for which computation has not been completed yet in the state number candidate set, as the number of states.

The initialization unit 103 initializes the component type, the variational probability of the latent variable, the parameter of each component, and the free parameter selection variable for estimation, according to the number of states set by the state number setting unit 102. For example, the initialization unit 103 randomly selects the component type, and also randomly sets the initial value of the parameter according to the selected type and the initial values of the variational probability of the latent variable and the free parameter selection variable. The variation probability of the latent variable is an approximate value of the posterior probability of the latent variable to calculate a marginal likelihood.

The latent variable variational probability computation unit 111 estimates the variational probability of the latent variable, based on the currently set component type, parameter, and free parameter selection variable. In detail, the latent variable variational probability computation unit 111 acquires the observed value data, and the component type, model parameter, variational probability of the latent variable, and free parameter selection variable set by the initialization unit 103. In the case where it is determined in the below-mentioned convergence determination process that the convergence has not been completed and so the computation is to be performed again, the latent variable variational probability computation unit 111 acquires the component type and the model parameter previously estimated by the component optimization unit 112, the variational probability of the latent variable previously computed by the latent variable variational probability computation unit 111, and the free parameter selection variable previously output from the free parameter selection variable computation unit 113. The latent variable variational probability computation unit 111 computes the variational probability of the latent variable so as to maximize the lower bound of the model posterior probability limited in degree of freedom by the free parameter selection variable, using these acquired data. The model posterior probability is a model posterior probability when an observed value was acquired.

The latent variable variational probability computation unit 111 computes the variational probability q(z), by maximizing the lower bound of the model posterior probability limited in degree of freedom. The lower bound of the model posterior probability limited in degree of freedom is described first. The model posterior probability limited in degree of freedom is represented as in the following Expression (8).

$$\log p(x^N \mid \xi, M) = \log \sum_z \int p(\phi, \alpha) \prod_i p(z_i \mid \alpha) p(x_i \mid z_i, \phi, \xi) d\phi d\alpha \tag{8}$$

The lower bound of Expression (8) is represented using the variational probability q(z) as in the following Expression (9).

$$\log p(x^N \mid \xi, M) \geq \sum_z q(z^N)\left[\log \int p(\phi, \alpha) \prod_i p(z_i \mid \alpha) p(x_i \mid z_i, \phi, \xi) d\phi d\alpha - \log q(z^N)\right] \tag{9}$$

Laplace-approximating the integral on the right side of Expression (9) yields the lower bound as shown in the following Expression (11). K is the number of possible states. $D_k(H, \xi)$ is the degree of freedom of the model of the component k in the case where the model of each component is selected in H, and is represented as in the following Expression (10).

$$D_k(H, \xi) = \sum_j \xi_{kj} \tag{10}$$

$$\log p(x^N \mid \xi, M) \geq \sum_z q(z^N)\left[\log p(x_N \mid z_N, \hat{\phi}, \xi) + \log p(z_N \mid \hat{\alpha}) - \frac{K}{2}\log N - \sum_k \frac{D_k(H, \xi)}{2} \log \sum_i z_{i,k} - \log q(z_N)\right] \tag{11}$$

Furthermore, based on the fact that the logarithm function is a concave function, the lower bound is computed as shown in the following Expression (12).

$$\log p(x^N \mid \xi, M) \geq \sum_z q(z^N)\left[\log p(x_N \mid z_N, \phi, \xi) + \log p(z_N \mid \alpha) - \frac{K}{2}\log N - \sum_k \frac{D_k(H, \xi)}{2}\left(\log \sum_i \tilde{q}(z_{i,k}) + \frac{\sum_i z_{i,k}}{\sum_i \tilde{q}(z_{i,k})} - 1\right) - \log q(z_N)\right] = g(H, q, \tilde{q}, \phi, \alpha, \xi) \tag{12}$$

The latent variable variational probability computation unit 111 finds such q that maximizes the function of the lower bound. The function of the lower bound is referred to as “optimization criterion”. q (tilded) is maximum when the value of q at the immediately previous update is used, and so the value of q at the immediately previous update is assigned to q (tilded). The value of each variational probability or parameter at the t-th update is designated by the superscript (t). The latent variable variational probability computation unit 111 computes the value of the variational probability as shown in the following Expression (13).

$$q^{(t)} = \arg\max_q \; g\left(H^{(t-1)}, q, q^{(t-1)}, \phi^{(t-1)}, \alpha^{(t-1)}, \xi\right) \tag{13}$$

The component optimization unit 112 estimates the component type and parameter, based on the current variational probability of the latent variable. In detail, the component optimization unit 112 acquires the observed value data, and the component type, model parameter, variational probability of the latent variable, and free parameter selection variable set by the initialization unit 103. In the case where it is determined in the below-mentioned convergence determination process that the convergence has not been completed and so the computation is to be performed again, the component optimization unit 112 acquires the component type and the model parameter previously estimated by the component optimization unit 112, the variational probability of the latent variable previously computed by the latent variable variational probability computation unit 111, and the free parameter selection variable previously output from the free parameter selection variable computation unit 113.

The component optimization unit 112 estimates an optimal mixture model and parameter by optimizing the component type and parameter so as to maximize the lower bound of the model posterior probability limited in degree of freedom by the free parameter selection variable and separated for each component of the mixture model, using the acquired data. In detail, the component optimization unit 112 computes the component type H and the parameter $\phi$, by maximizing the lower bound of the model posterior probability limited in degree of freedom. The component optimization unit 112 finds the lower bound in the same way as the latent variable variational probability computation unit 111, and computes the component type and parameter as in the following Expression (14). This lower bound can be computed for each component. Therefore, the component optimization unit 112 can optimize the component type, with no need for computation for all combinations of component types.

$$(H^{(t)}, \phi^{(t)}, \alpha^{(t)}) = \arg\max_{H,\phi,\alpha} g(H, q^{(t)}, q^{(t)}, \phi, \alpha, \xi) \quad (14)$$

The free parameter selection variable computation unit 113 selects a parameter estimated as a free parameter, from the result obtained by the component optimization unit 112. In other words, the free parameter selection variable computation unit 113 computes the free parameter selection variable. In detail, the free parameter selection variable computation unit 113 acquires the current variational probability of the latent variable and component type and parameter and, for each component, estimates each parameter by assigning 1 to the free parameter selection variable only when it significantly contributes to the observed value.

For example, the free parameter selection variable computation unit 113 may, for each component k, estimate the parameter by assigning an L1 regularization term using only a sample of positive variational probability, and set $\xi_{kj}=1$ only when the absolute value of the parameter j is greater than or equal to a threshold.

The optimality determination unit 114 determines whether or not to continue the maximization of the model posterior probability limited in degree of freedom, based on the current variational probability of the latent variable, component type and parameter, observed data, and free parameter selection variable. The optimality determination unit 114 determines whether or not the difference from the optimization criterion at the previous update is sufficiently small, and determines to end the maximization if the difference is small and to continue the maximization if the difference is large.

In the case of determining to continue the maximization, the optimality determination unit 114 outputs the variational probability of the latent variable and the component type and parameter to the latent variable variational probability computation unit 111. In the case of determining to end the maximization, the optimality determination unit 114 enforces, if there is any element for which the computation has not been completed yet in the input state number candidate set, the computation for the element. If the computation has been completed for all state number candidates, the optimality determination unit 114 outputs the variational probability of the latent variable and the component type and parameter for the number of states corresponding to the largest optimization criterion of all state number candidates, to the result output unit 121.

Thus, the model estimation device in this exemplary embodiment repeatedly performs the process of computing the variational probability of the latent variable and the component type and parameter until the optimization criterion converges. The optimization criterion increases with each iteration of the process.

The result output unit 121 outputs the acquired variational probability of the latent variable and component type and parameter.

Latent states show a value to be set in a latent variable. A number of latent states show the number of candidates of the value to be set in a latent variable. The user can determine the number of latent states and the latent states, from the variational probability of the latent variable. For example, the user can select a latent state with a largest variational probability, from a plurality of latent states corresponding to each sample. The user can also set the number of latent states corresponding to a positive sum of variational probabilities in each sample, as the number of latent states.

The following describes an operation of the model estimation device in this exemplary embodiment. FIG. 2 is a flowchart showing the operation of the model estimation device in this exemplary embodiment.

First, the data input unit 101 acquires data including the observed value data, the component type candidate, the state number candidate set, and the convergence determination criterion (step A1).

Next, the state number setting unit 102 sets a number of an element for which the computation has not been performed yet in the state number candidate set, as the number of states (step A2).

Next, the initialization unit 103 initializes the variational probability of the latent variable, the component type, the model parameter, and the free parameter selection variable according to the number of states (step A3).

Next, the latent variable variational probability computation unit 111 computes the variational probability of the latent variable so as to maximize the lower bound of the model posterior probability limited in degree of freedom (step A4).

Next, the component optimization unit 112 computes the model type (component type) and the model parameter so as to maximize the lower bound of the model posterior probability limited in degree of freedom (step A5).

Next, the free parameter selection variable computation unit 113 computes the free parameter selection variable (step A6).

Next, the optimality determination unit 114 determines whether or not the optimization criterion has converged (step A7). If the optimization criterion has not converged (step A8: NO), the model estimation device returns to step A4 to repeat the process of steps A4 to A7.

If the optimization criterion has converged (step A8: YES), the model estimation device proceeds to step A9.

The optimality determination unit 114 then determines whether or not the computation has been completed for all input state number candidates (step A9).

If the computation has not been completed, the model estimation device returns to step A2 to repeat the process of steps A2 to A8.

If the computation has been completed, the optimality determination unit 114 selects the model with the largest optimization criterion from the computed model selection results (step A10). The result output unit 121 outputs the selected result (step A11).

Model selection and model estimation are achieved in this way. Though this exemplary embodiment describes the procedure of computing the variational probability of the latent variable, then estimating the component type and the model parameter, and then computing the free parameter selection variable, the order of the three processes may be changed.

With the use of the model estimation device in this exemplary embodiment, the user can determine the number of latent states and the latent states from the variational probability of the latent variable. Even if the parameter of the component has a big dimension, the model estimate device in this exemplary embodiment can reduce an estimation error by calculating the free parameter selection variable.

Exemplary Embodiment 2

Figure 3:
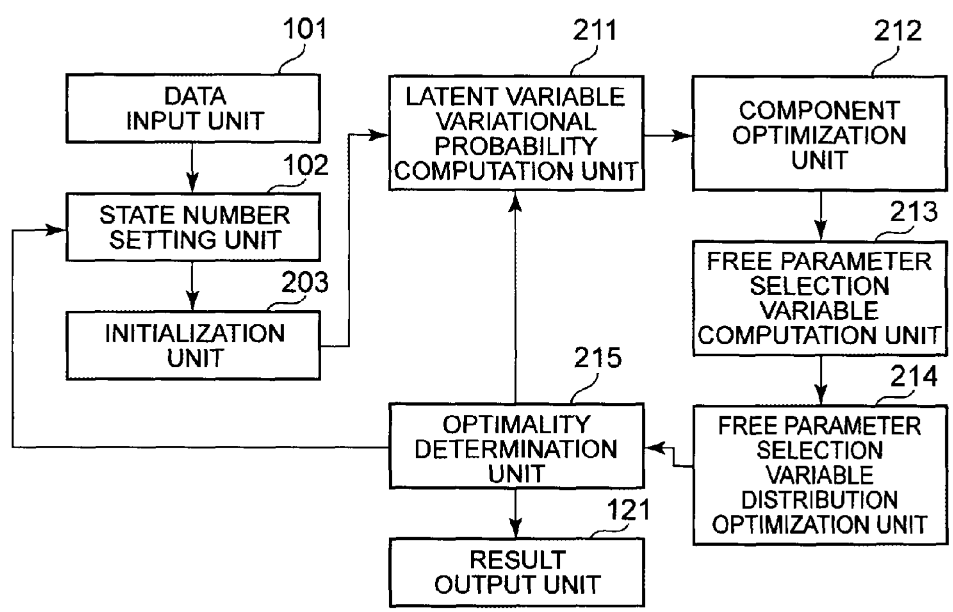
FIG. 3 is a block diagram showing a structure of Exemplary Embodiment 2 of the model estimation device according to the present invention.

A method of performing modeling that also involves ξ and estimating the model is described in Exemplary Embodiment 2. FIG. 3 is a block diagram showing a structure of a model estimation device in Exemplary Embodiment 2. The description of the same structural elements as in Exemplary Embodiment 1 is omitted.

An initialization unit 203 sets initial values of the variational probability of the latent variable, the parameter, and the free parameter selection variable. In detail, the initialization unit 203 initializes the component type, the variational probability of the latent variable, the parameter of each component, the free parameter selection variable, and a parameter of a free parameter selection variable distribution for estimation, according to the number of states set by the state number setting unit 102. For example, the initialization unit 203 randomly selects the component type, and also randomly sets the initial values of the parameter according to the selected type, the variational probability of the latent variable, the free parameter selection variable, and the parameter of the free parameter selection variable distribution.

A latent variable variational probability computation unit 211 estimates the variational probability of the latent variable, based on the currently set component type, parameter, and free parameter selection variable. In detail, the latent variable variational probability computation unit 211 acquires the observed value data, and the component type, model parameter, variational probability of the latent variable, free parameter selection variable, and parameter of the free parameter selection variable distribution set by the initialization unit 203. In the case where it is determined in the below-mentioned convergence determination process that the convergence has not been completed and so the computation is to be performed again, the latent variable variational probability computation unit 211 acquires the component type and the model parameter previously estimated by a component optimization unit 212, the variational probability of the latent variable previously computed by the latent variable variational probability computation unit 211, the free parameter selection variable previously output from a free parameter selection variable computation unit 213, and the free parameter selection variable distribution previously computed by a free parameter selection variable distribution optimization unit 214. The latent variable variational probability computation unit 211 computes the variational probability of the latent variable so as to maximize the lower bound of the model posterior probability limited in degree of freedom by the free parameter selection variable, using these acquired data.

The latent variable variational probability computation unit 211 computes the variational probability q(z), by maximizing the lower bound of the model posterior probability limited in degree of freedom. The lower bound of the model posterior probability limited in degree of freedom is described first. The logarithm model posterior probability limited in degree of freedom is represented as in the following Expression (15).

$$\log p(x^N \mid \beta, M) = \log \sum_z \int p(\phi, \alpha, \beta) \prod_i p(z_i \mid \alpha) p(x_i \mid z_i, \phi, \xi) p(\xi \mid \beta) d\phi d\alpha \tag{15}$$

Here, p(ξ|β) is a distribution of ξ arbitrarily set beforehand.

The lower bound of Expression (15) can be represented using the variational probability q(z) and r(ξ) as in the following Expression (16).

$$\log p(x^N \mid \beta, M) \geq \sum_z q(z^N) \sum_\xi r(\xi) \left[ \log \int p(\phi, \alpha, \beta) \prod_i p(z_i \mid \alpha) p(x_i \mid z_i, \phi, \xi) p(\xi \mid \beta) d\phi d\alpha - \log q(z^N) - \log r(\xi) \right] \tag{16}$$

Laplace-approximating the integral on the right side of Expression (16) yields the lower bound as shown in the following Expression (17). K is the number of possible states. $D_k(H, \xi)$ is the degree of freedom of the model of the component k in the case where the model of each component is selected in H, and is represented as in Expression (10). Note that the present invention is not limited to this method, and a specific prior distribution may be assumed and analytically integrated out.

$$\log p(x^N \mid \beta, M) \geq \sum_z q(z^N) \sum_\xi r(\xi) \left[ \log p\left(x_N \mid z_N, \hat{\phi}\right) + \log p(z_N \mid \hat{\alpha}) + \log p(\xi \mid \beta) - \frac{K}{2} \log N - \sum_k \frac{D_k(H, \xi)}{2} \log \sum_i z_{i,k} - \log q(z_N) - \log r(\xi) \right] \tag{17}$$

Furthermore, based on the fact that the logarithm function is a concave function, the lower bound is computed as shown in the following Expression (18).

$$\log p(x^N \mid M) \geq \sum_z q(z^N) \sum_\xi r(\xi) \left[ \log p(x_N \mid z_N, \phi, \xi) + \log p(z_N \mid \alpha) + \log p(\xi \mid \beta) - \frac{K}{2} \log N - \sum_k \frac{D_k(H, \xi)}{2} \left( \log \sum_i \tilde{q}(z_{i,k}) + \frac{\sum_i z_{i,k}}{\sum_i \tilde{q}(z_{i,k})} - 1 \right) - \log q(z_N) - \log r(\xi) \right] = g(H, q, \tilde{q}, \phi, \alpha, r, \beta) \tag{18}$$

The latent variable variational probability computation unit 211 finds such q that maximizes the function of the lower bound. The function of the lower bound is referred to as "optimization criterion". q (tilded) is maximum when the value of q at the immediately previous update is used, and so the value of q at the immediately previous update is assigned to q (tilded). The value of each variational probability or parameter at the t-th update is designated by the superscript (t). The latent variable variational probability computation unit 211 computes the value of the variational probability as shown in the following Expression (19).

$$q^{(t)} = \arg\max_{q} g\,(H^{(t-1)}, q, q^{(t-1)}, \phi^{(t-1)}, \alpha^{(t-1)}, r^{(t-1)}, \beta^{(t-1)}) \quad (19)$$

The component optimization unit 212 estimates the component type and parameter, based on the current variational probability of the latent variable. In detail, the component optimization unit 212 acquires the observed value data, and the component type, model parameter, variational probability of the latent variable, free parameter selection variable, and parameter of the free parameter selection variable distribution set by the initialization unit 203. In the case where it is determined in the below-mentioned convergence determination process that the convergence has not been completed and so the computation is to be performed again, the component optimization unit 212 acquires the component type and the model parameter previously estimated by the component optimization unit 212, the variational probability of the latent variable previously computed by the latent variable variational probability computation unit 211, the free parameter selection variable previously output from the free parameter selection variable computation unit 213, and the free parameter selection variable distribution previously computed by the free parameter selection variable distribution optimization unit 214.

The component optimization unit 212 estimates an optimal mixture model and parameter by optimizing the component type and parameter so as to maximize the lower bound of the model posterior probability limited in degree of freedom by the free parameter selection variable and separated for each component of the mixture model, using the acquired data. The component optimization unit 212 computes the component type H and the parameter ϕ, by maximizing the lower bound of the model posterior probability limited in degree of freedom. The component optimization unit 212 finds the lower bound as described with regard to the latent variable variational probability computation unit, and computes the component type and parameter as in the following Expression (20). This lower bound can be computed for each component. Therefore, the component optimization unit 212 can optimize the component type, with no need for computation for all combinations of component types.

$$(H^{(t)}, \phi^{(t)}, \alpha^{(t)}) = \arg\max_{H,\phi,\alpha} g\,(H, q^{(t)}, q^{(t)}, \phi, \alpha, r^{(t-1)}, \beta^{(t-1)}) \quad (20)$$

The free parameter selection variable computation unit 213 receives input of the current variational probability of the latent variable and component type and parameter, and computes the variational probability of the free parameter selection variable by maximizing the lower bound of the model posterior probability limited in degree of freedom as in the following Expression (21) about r.

The free parameter selection variable distribution optimization unit 214 acquires the variational probability of the free parameter selection variable previously computed by the free parameter selection variable computation unit 213, and computes the parameter of the free parameter selection variable distribution as in the following Expression (21) about β.

$$(r^{(t)}, \beta^{(t)}) = \arg\max_{r,\beta} g\,(H, q^{(t)}, q^{(t)}, \phi, \alpha, r^{(t-1)}, \beta^{(t-1)}) \quad (21)$$

An optimality determination unit 215 determines whether or not to continue the maximization of the model posterior probability limited in degree of freedom, based on the current variational probability of the latent variable, component type and parameter, observed data, and free parameter selection variable. The optimality determination unit 215 determines whether or not the difference from the optimization criterion at the previous update is sufficiently small, and determines to end the maximization if the difference is small and to continue the maximization if the difference is large.

In the case of determining to continue the maximization, the optimality determination unit 215 outputs the variational probability of the latent variable and the component type and parameter to the latent variable variational probability computation unit 211. In the case of determining to end the maximization, the optimality determination unit 215 enforces, if there is any element for which the computation has not been completed yet in the input state number candidate set, the computation for the element. If the computation has been completed for all state number candidates, the optimality determination unit 215 outputs the variational probability of the latent variable and the component type and parameter for the number of states corresponding to the largest optimization criterion of all state number candidates, to the result output unit 121.

Thus, the model estimation device in this exemplary embodiment repeatedly performs the process of computing the variational probability of the latent variable and the component type and parameter until the optimization criterion converges. The optimization criterion increases with each iteration of the process.

The following describes an operation of Exemplary Embodiment 2, with reference to a flowchart shown in FIG. 4.

First, the data input unit 101 receives input of the observed value data, the component type candidate, the state number candidate set, and the convergence determination criterion (step A1).

Next, the state number setting unit 102 sets a number of an element for which the computation has not been performed yet in the state number candidate set, as the number of states (step A2).

Next, the initialization unit 203 initializes the variational probability of the latent variable, the component type, the model parameter, and the free parameter selection variable according to the number of states (step A3).

Next, the latent variable variational probability computation unit 211 computes the variational probability of the latent variable so as to maximize the lower bound of the model posterior probability limited in degree of freedom (step A4).

Next, the component optimization unit 212 computes the component type and the model parameter so as to maximize the lower bound of the model posterior probability limited in degree of freedom (step A5).

The free parameter selection variable computation unit 213 computes the variational probability of the free parameter selection variable (step B1).

Next, the free parameter selection variable distribution optimization unit 214 computes the parameter of the free parameter selection variable distribution (step B2).

Next, the optimality determination unit 215 determines whether or not the optimization criterion has converged (step A7). If the optimization criterion has not converged (step A8: NO), the model estimation device returns to step A4 to repeat the process of steps A4 to A7.

If the optimization criterion has converged (step A8: YES), the model estimation device proceeds to step A9.

The optimality determination unit 215 then determines whether or not the computation has been completed for all input state number candidates (step A9).

If the computation has not been completed, the model estimation device returns to step A2 to repeat the process of steps A2 to A8.

If the computation has been completed, the optimality determination unit 215 selects the model with the largest optimization criterion from the computed model selection results (step A10). The result output unit 121 outputs the selected result (step A11).

Model selection and model estimation are achieved in this way. The model estimate device of this exemplary embodiment can choose a freedom parameter by a method same as the latent variable variational probability computation unit 211 and the component optimization unit 212 called the maximization of the model posterior probability. Though this exemplary embodiment describes the procedure of computing the variational probability of the latent variable, then computing the component type and the model parameter, then computing the variational probability of the free parameter selection variable, and computing the parameter of the free parameter selection variable distribution, the order of the four processes may be changed.

Exemplary Embodiment 3

Figure 5:
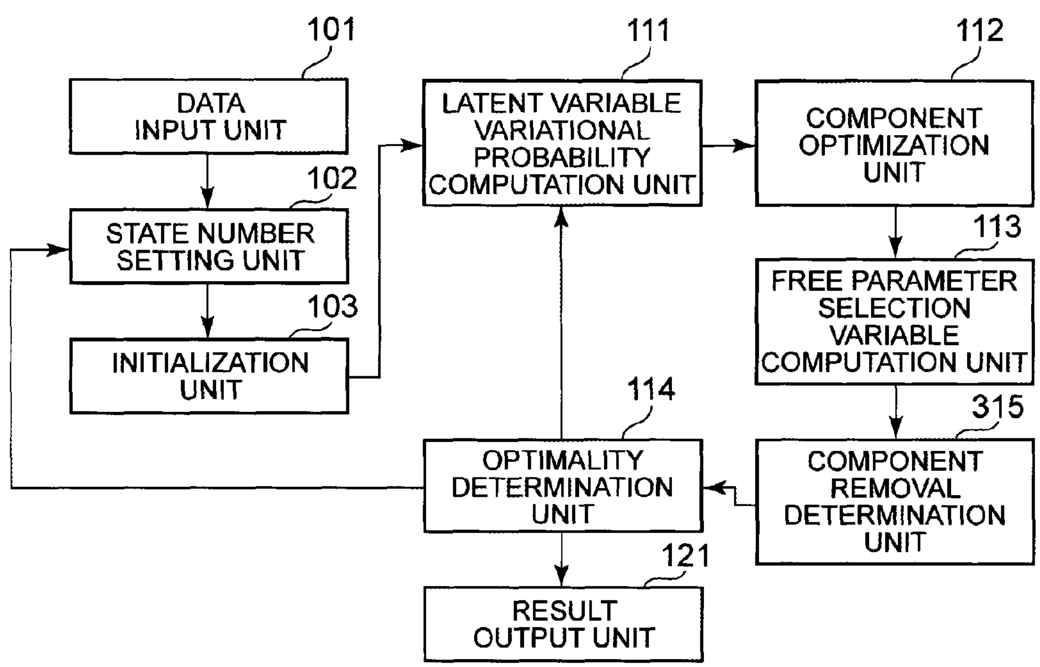
FIG. 5 is a block diagram showing a structure of Exemplary Embodiment 3 of the model estimation device according to the present invention.

FIG. 5 is a block diagram showing a structure of a model estimation device in Exemplary Embodiment 3. The model estimation device in this exemplary embodiment includes a component removal determination unit 315, in addition to the structure in Exemplary Embodiment 1 shown in FIG. 1. Since the structural elements of the model estimation device in this exemplary embodiment other than the component removal determination unit 315 are the same as those in Exemplary Embodiment 1 shown in FIG. 1, their description is omitted.

The component removal determination unit 315 determines whether or not to estimate all latent variable variational probabilities of a component as 0, based on the latent variable variational probabilities output from the component optimization unit 112.

A component removal determination unit 315 acquires the variational probability of the latent variable and, for each component, sets variational probabilities of the component to 0 if a sum of the variational probabilities is less than a threshold. In the case where the component k satisfies the following Expression (22), the component removal determination unit 315 estimates all latent variable variational probabilities of the component as 0.

$$\sum_i q(z_{i,k}) < \epsilon \tag{22}$$

FIG. 6 is a flowchart showing an operation of the model estimation device in this exemplary embodiment. The flowchart shown in FIG. 6 is different from the flowchart in Exemplary Embodiment 1 shown in FIG. 2, only in that step C1 is inserted between steps A6 and A7. Accordingly, the description of the same operations as in Exemplary Embodiment 1 shown in FIG. 2 is omitted.

The component removal determination unit 315 sets the variational probabilities of any component satisfying the criterion, to 0 (step C1).

With the provision of the component removal determination unit 315, the model estimation device in this exemplary embodiment can more quickly estimate the component whose latent variable variational probability sum converges to 0, as 0. The model estimation device in this exemplary embodiment is thus capable of estimation at higher speed.

The model estimation device in this exemplary embodiment may have a structure in which the component removal determination unit 315 is added to the model estimation device in Exemplary Embodiment 2. The operation of the model estimation device in this exemplary embodiment in this case is shown by a flowchart in which step C1 is inserted between steps B2 and A7 shown in FIG. 4.

Example 1

Latent Dirichlet Allocation

Document creation models are a typical example where the dimensionality of parameters of components is very large.

The model estimation device in each of Exemplary Embodiments 1 to 3 is applicable to Latent Dirichlet Allocation models in NPL 1. This enables models to be selected based on appropriate criteria at high speed, without manually tuning the number of topics.

For instance, in the case of clustering search result document sets so that the search results can be recognized at a glance, the number of clusters is different depending on the search result set. The model estimation device in each of Exemplary Embodiments 1 to 3 can tune the number of topics at high speed and estimate the topics belonging to each set, and so is applicable to the case of clustering many document sets.

Example 2

Clustering Stores with Similar Sales

It is expected that deciding the range of products in a retail store based on the sales of stores with similar sales is useful. In the case of modeling the product sales in each store in order to cluster stores with similar sales, the dimensionality of components is large due to a large number of products. Even in such a case, the model estimation device in each of Exemplary Embodiments 1 to 3 enables clustering to be performed without setting the number of clusters of stores.

A structure of main parts according to the present invention is described below. A model estimation device according to the present invention includes, as main structural elements: a data input unit 101 for acquiring observed value data subjected to estimation of a latent variable model, a type of each component constituting the latent variable model, and a state number candidate set of the latent variable model; a state number setting unit 102 for setting an element for which computation has not been completed yet in the state number candidate set, as the number of states; an initialization unit 103 for setting initial values of a variational probability of a latent variable, a parameter, the type of each component, and a free parameter selection variable; a latent variable variational probability computation unit 111 for acquiring the observed value data and the variational probability of the latent variable, the type of each component, the parameter, and the free parameter selection variable set by the initialization unit 103, and computing the variational probability of the latent variable so as to maximize a lower bound of a model posterior probability limited in degree of freedom by the free parameter selection variable; a component optimization unit 112 for acquiring the observed value data and the variational probability of the latent variable, the type of each component, the parameter, and the free parameter selection variable set by the initialization unit 103, and estimating an optimal type of each component and a parameter thereof by optimizing the type of each component and the parameter so as to maximize the lower bound of the model posterior probability limited in degree of freedom by the free parameter selection variable and separated for each component of the latent variable model; a free parameter selection variable computation unit 113 for acquiring the type of each component and the parameter thereof estimated by the component optimization unit 112 and the variational probability of the latent variable computed by the latent variable variational probability computation unit 111, and computing the free parameter selection variable; an optimality determination unit 114 for acquiring the observed value data, the type of each component and the parameter thereof estimated by the component optimization unit 112, the variational probability of the latent variable computed by the latent variable variational probability computation unit 111, and the free parameter selection variable computed by the free parameter selection variable computation unit 113, and determining whether or not to continue the maximization of the lower bound of the model posterior probability limited in degree of freedom; and a result output unit 121 for outputting the variational probability of the latent variable computed by the latent variable variational probability computation unit 111 and the type of each component and the parameter thereof estimated by the component optimization unit 112.

A model estimation device described in the following (1) to (3) is also disclosed in the exemplary embodiments described above.

(1) A model estimation device including: a data input unit 101 for acquiring observed value data subjected to estimation of a latent variable model, a type of each component constituting the latent variable model, and a state number candidate set of the latent variable model; a state number setting unit 102 for setting an element for which computation has not been completed yet in the state number candidate set, as the number of states; an initialization unit 203 for setting initial values of a variational probability of a latent variable, a parameter, the type of each component, a free parameter selection variable, and a parameter of a free parameter selection variable distribution; a latent variable variational probability computation unit 211 for acquiring the observed value data and the variational probability of the latent variable, the type of each component, the parameter, the free parameter selection variable, and the parameter of the free parameter selection variable distribution set by the initialization unit 203, and computing the variational probability of the latent variable so as to maximize a lower bound of a model posterior probability limited in degree of freedom by the free parameter selection variable; a component optimization unit 212 for acquiring the observed value data and the variational probability of the latent variable, the type of each component, the parameter, the free parameter selection variable, and the parameter of the free parameter selection variable distribution set by the initialization unit 203, and estimating an optimal type of each component and a parameter thereof by optimizing the type of each component and the parameter so as to maximize the lower bound of the model posterior probability limited in degree of freedom by the free parameter selection variable and separated for each component of the latent variable model; a free parameter selection variable computation unit 213 for acquiring the type of each component and the parameter thereof estimated by the component optimization unit 212 and the variational probability of the latent variable computed by the latent variable variational probability computation unit 211, and computing the free parameter selection variable; a free parameter selection variable distribution optimization unit 214 for acquiring the free parameter selection variable computed by the free parameter selection variable computation unit 213, and computing the parameter of the free parameter selection variable distribution; an optimality determination unit 215 for acquiring the observed value data, the type of each component and the parameter thereof estimated by the component optimization unit 212, the variational probability of the latent variable computed by the latent variable variational probability computation unit 211, the free parameter selection variable computed by the free parameter selection variable computation unit 213, and the parameter of the free parameter selection variable distribution computed by the free parameter selection variable distribution optimization unit 214, and determining whether or not to continue the maximization of the lower bound of the model posterior probability limited in degree of freedom; and a result output unit 121 for outputting the variational probability of the latent variable computed by the latent variable variational probability computation unit 211 and the type of each component and the parameter thereof estimated by the component optimization unit 212.

(2) The model estimation device may include a component removal determination unit (e.g. the component removal determination unit 315) for acquiring the variational probability of the latent variable and, for each component, setting variational probabilities of the component to 0 if a sum of the variational probabilities is less than a threshold.

(3) In the model estimation device, in the case where the optimality determination unit determines to continue the maximization of the lower bound of the model posterior probability, the latent variable variational probability computation unit may acquire the type of each component and the parameter previously estimated by the component optimization unit and the variational probability of the latent variable previously computed by the latent variable variational probability computation unit, and compute again the variational probability of the latent variable so as to maximize the lower bound of the model posterior probability, wherein the component optimization unit acquires the type of each component and the parameter previously estimated by the component optimization unit and the variational probability of the latent variable previously computed by the latent variable variational probability computation unit, and estimates again the optimal type of each component and the parameter thereof by optimizing the type of each component and the parameter so as to maximize the lower bound of the model posterior probability separated for each component of the latent variable model.

Moreover, an information storage medium described in the following (Supplementary note 1) to (Supplementary note 4) is also disclosed in the exemplary embodiments described above.

(Supplementary note 1) A computer-readable non-transitory information recording medium storing a model estimation program that, when executed by an information processing device, causes execution of a method including: acquiring observed value data subjected to estimation of a latent variable model, a type of each component constituting the latent variable model, and a state number candidate set of the latent variable model; setting an element for which computation has not been completed yet in the state number candidate set, as the number of states; setting initial values of a variational probability of a latent variable, a parameter, the type of each component, and a free parameter selection variable; acquiring the observed value data and the set variational probability of the latent variable, type of each component, parameter, and free parameter selection variable, and computing the variational probability of the latent variable so as to maximize a lower bound of a model posterior probability limited in degree of freedom by the free parameter selection variable; acquiring the observed value data and the set variational probability of the latent variable, type of each component, parameter, and free parameter selection variable, and estimating an optimal type of each component and a parameter thereof by optimizing the type of each component and the parameter so as to maximize the lower bound of the model posterior probability limited in degree of freedom by the free parameter selection variable and separated for each component of the latent variable model; acquiring the estimated type of each component and parameter thereof and the computed variational probability of the latent variable, and computing the free parameter selection variable; acquiring the observed value data, the estimated type of each component and parameter thereof, the computed variational probability of the latent variable, and the computed free parameter selection variable, and determining whether or not to continue the maximization of the lower bound of the model posterior probability limited in degree of freedom; and outputting the computed variational probability of the latent variable and the estimated type of each component and parameter thereof.

(Supplementary note 2) A computer-readable non-transitory information recording medium storing a model estimation program that, when executed by an information processing device, causes execution of a method including: acquiring observed value data subjected to estimation of a latent variable model, a type of each component constituting the latent variable model, and a state number candidate set of the latent variable model; setting an element for which computation has not been completed yet in the state number candidate set, as the number of states; setting initial values of a variational probability of a latent variable, a parameter, the type of each component, a variational probability of a free parameter selection variable, and a parameter of a free parameter selection variable distribution; acquiring the observed value data and the set variational probability of the latent variable, type of each component, parameter, the variational probability of free parameter selection variable, and parameter of the free parameter selection variable distribution, and computing the variational probability of the latent variable so as to maximize a lower bound of a model posterior probability limited in degree of freedom by the free parameter selection variable; acquiring the observed value data and the set variational probability of the latent variable, type of each component, parameter, the variational probability of free parameter selection variable, and parameter of the free parameter selection variable distribution, and estimating an optimal type of each component and a parameter thereof by optimizing the type of each component and the parameter so as to maximize the lower bound of the model posterior probability limited in degree of freedom by the free parameter selection variable and separated for each component of the latent variable model; acquiring the estimated type of each component and parameter thereof and the computed variational probability of the latent variable, and computing the variational probability of free parameter selection variable; acquiring the computed the variational probability of free parameter selection variable, and computing the parameter of the free parameter selection variable distribution; acquiring the observed value data, the estimated type of each component and parameter thereof, the computed variational probability of the latent variable, the computed the variational probability of free parameter selection variable, and the computed parameter of the free parameter selection variable distribution, and determining whether or not to continue the maximization of the lower bound of the model posterior probability limited in degree of freedom; and outputting the computed variational probability of the latent variable and the estimated type of each component and parameter thereof.

(Supplementary note 3) The computer-readable non-transitory information recording medium storing the model estimation program that, when executed by the information processing device, causes the execution of the method including acquiring the variational probability of the latent variable and, for each component, setting variational probabilities of the component to 0 if a sum of the variational probabilities is less than a threshold.

(Supplementary note 4) The computer-readable non-transitory information recording medium storing the model estimation program that, when executed by the information processing device, causes the execution of the method wherein in the case of determining to continue the maximization of the lower bound of the model posterior probability: the previously estimated type of each component and parameter and the previously computed variational probability of the latent variable are acquired, and the variational probability of the latent variable is computed again so as to maximize the lower bound of the model posterior probability; and the previously estimated type of each component and parameter and the previously computed variational probability of the latent variable are acquired, and the optimal type of each component and the parameter thereof are estimated again by optimizing the type of each component and the parameter so as to maximize the lower bound of the model posterior probability separated for each component of the latent variable model.

INDUSTRIAL APPLICABILITY

The present invention is applicable to estimation of latent variable models in which the dimensionality of parameters of components is large.

REFERENCE SIGNS LIST

101 data input unit
102 state number setting unit
103, 203 initialization unit
111, 211 latent variable variational probability computation unit
112, 212 component optimization unit
113, 213 free parameter selection variable computation unit
114, 215 optimality determination unit
121 result output unit
214 free parameter selection variable distribution optimization unit
315 component removal determination unit

What is claimed is:

1. A model estimation device comprising:

a data input unit which acquires observed value data subjected to estimation of a latent variable model, a type of each component constituting the latent variable model, and a state number candidate set of the latent variable model;

a state number setting unit which sets an element for which computation has not been completed yet in the state number candidate set, as the number of states;

an initialization unit which sets initial values of a variational probability of a latent variable, a parameter, the type of each component, and a free parameter selection variable;

a latent variable variational probability computation unit which acquires the observed value data and the variational probability of the latent variable, the type of each component, the parameter, and the free parameter selection variable set by the initialization unit, and computes the variational probability of the latent variable so as to maximize a lower bound of a model posterior probability limited in degree of freedom by the free parameter selection variable;

a component optimization unit which acquires the observed value data and the variational probability of the latent variable, the type of each component, the parameter, and the free parameter selection variable set by the initialization unit, and estimates an optimal type of each component and a parameter thereof by optimizing the type of each component and the parameter so as to maximize the lower bound of the model posterior probability limited in degree of freedom by the free parameter selection variable and separated for each component of the latent variable model;

a free parameter selection variable computation unit which acquires the type of each component and the parameter thereof estimated by the component optimization unit and the variational probability of the latent variable computed by the latent variable variational probability computation unit, and computes the free parameter selection variable;

an optimality determination unit which acquires the observed value data, the type of each component and the parameter thereof estimated by the component optimization unit, the variational probability of the latent variable computed by the latent variable variational probability computation unit, and the free parameter selection variable computed by the free parameter selection variable computation unit, and determines whether or not to continue the maximization of the lower bound of the model posterior probability limited in degree of freedom; and a result output unit which outputs the variational probability of the latent variable computed by the latent variable variational probability computation unit and the type of each component and the parameter thereof estimated by the component optimization unit.

2. A model estimation device comprising:

a data input unit which acquires observed value data subjected to estimation of a latent variable model, a type of each component constituting the latent variable model, and a state number candidate set of the latent variable model;

a state number setting unit which sets an element for which computation has not been completed yet in the state number candidate set, as the number of states;

an initialization unit which sets initial values of a variational probability of a latent variable, a parameter, the type of each component, a variational probability of a free parameter selection variable, and a parameter of a free parameter selection variable distribution;

a latent variable variational probability computation unit which acquires the observed value data and the variational probability of the latent variable, the type of each component, the parameter, the variational probability of the free parameter selection variable, and the parameter of the free parameter selection variable distribution set by the initialization unit, and computes the variational probability of the latent variable so as to maximize a lower bound of a model posterior probability limited in degree of freedom by the free parameter selection variable;

a component optimization unit which acquires the observed value data and the variational probability of the latent variable, the type of each component, the parameter, the variational probability of the free parameter selection variable, and the parameter of the free parameter selection variable distribution set by the initialization unit, and estimates an optimal type of each component and a parameter thereof by optimizing the type of each component and the parameter so as to maximize the lower bound of the model posterior probability limited in degree of freedom by the free parameter selection variable and separated for each component of the latent variable model;

a free parameter selection variable computation unit which acquires the type of each component and the parameter thereof estimated by the component optimization unit and the variational probability of the latent variable computed by the latent variable variational probability computation unit, and computes the variational probability of the free parameter selection variable;

a free parameter selection variable distribution optimization unit which acquires the variational probability of the free parameter selection variable computed by the free parameter selection variable computation unit, and computes the parameter of the free parameter selection variable distribution;

an optimality determination unit which acquires the observed value data, the type of each component and the parameter thereof estimated by the component optimization unit, the variational probability of the latent variable computed by the latent variable variational probability computation unit, the variational probability of the free parameter selection variable computed by the free parameter selection variable computation unit, and the parameter of the free parameter selection variable distribution computed by the free parameter selection variable distribution optimization unit, and determines whether or not to continue the maximization of the lower bound of the model posterior probability limited in degree of freedom; and a result output unit which outputs the variational probability of the latent variable computed by the latent variable variational probability computation unit and the type of each component and the parameter thereof estimated by the component optimization unit.

3. The model estimation device according to claim 1, comprising:

a component removal determination unit which acquires the variational probability of the latent variable and, for each component, sets variational probabilities of the component to 0 if a sum of the variational probabilities is less than a threshold.

4. The model estimation device according to claim 2, comprising:

a component removal determination unit which acquires the variational probability of the latent variable and, for each component, sets variational probabilities of the component to 0 if a sum of the variational probabilities is less than a threshold.

5. The model estimation device according to claim 1, wherein in the case where the optimality determination unit determines to continue the maximization of the lower bound of the model posterior probability:

the latent variable variational probability computation unit acquires the type of each component and the parameter previously estimated by the component optimization unit, the variational probability of the latent variable previously computed by the latent variable variational probability computation unit and the free parameter selection variable previously computed by the free parameter selection variable computation unit, and computes again the variational probability of the latent variable so as to maximize the lower bound of the model posterior probability;

the component optimization unit acquires the type of each component and the parameter previously estimated by the component optimization unit, the variational probability of the latent variable previously computed by the latent variable variational probability computation unit and the free parameter selection variable previously computed by the free parameter selection variable computation unit, and estimates again the optimal type of each component and the parameter thereof by optimizing the type of each component and the parameter so as to maximize the lower bound of the model posterior probability separated for each component of the latent variable model: and the free parameter selection variable computation unit acquires the type of each component and the parameter thereof previously estimated by the component optimization unit and the variational probability of the latent variable previously computed by the latent variable variational probability computation unit, and computes again the free parameter selection variable.

6. The model estimation device according to claim 2, wherein in the case where the optimality determination unit determines to continue the maximization of the lower bound of the model posterior probability:

the latent variable variational probability computation unit acquires the type of each component and the parameter previously estimated by the component optimization unit, the variational probability of the latent variable previously computed by the latent variable variational probability computation unit, the variational probability of the free parameter selection variable previously computed by the free parameter selection variable computation unit and the parameter of the free parameter selection variable distribution previously computed by the free parameter selection variable distribution optimization unit, and computes again the variational probability of the latent variable so as to maximize the lower bound of the model posterior probability;

the component optimization unit acquires the type of each component and the parameter previously estimated by the component optimization unit, the variational probability of the latent variable previously computed by the latent variable variational probability computation unit, the variational probability of the free parameter selection variable previously computed by the free parameter selection variable computation unit and the parameter of the free parameter selection variable distribution previously computed by the free parameter selection variable distribution optimization unit, and estimates again the optimal type of each component and the parameter thereof by optimizing the type of each component and the parameter so as to maximize the lower bound of the model posterior probability separated for each component of the latent variable model:

the free parameter selection variable computation unit acquires the type of each component and the parameter thereof previously estimated by the component optimization unit and the variational probability of the latent variable previously computed by the latent variable variational probability computation unit, and computes again the free parameter selection variable: and the free parameter selection variable distribution optimization unit acquires the variational probability of the free parameter selection variable previously computed by the free parameter selection variable computation unit, and computes again the parameter of the free parameter selection variable distribution.

7. A model estimation method comprising:

acquiring observed value data subjected to estimation of a latent variable model, a type of each component constituting the latent variable model, and a state number candidate set of the latent variable model;

setting an element for which computation has not been completed yet in the state number candidate set, as the number of states;

setting initial values of a variational probability of a latent variable, a parameter, the type of each component, and a free parameter selection variable;

acquiring the observed value data and the set variational probability of the latent variable, type of each component, parameter, and free parameter selection variable, and computing the variational probability of the latent variable so as to maximize a lower bound of a model posterior probability limited in degree of freedom by the free parameter selection variable;

acquiring the observed value data and the set variational probability of the latent variable, type of each component, parameter, and free parameter selection variable, and estimating an optimal type of each component and a parameter thereof by optimizing the type of each component and the parameter so as to maximize the lower bound of the model posterior probability limited in degree of freedom by the free parameter selection variable and separated for each component of the latent variable model;

acquiring the estimated type of each component and parameter thereof and the computed variational probability of the latent variable, and computing the free parameter selection variable;

acquiring the observed value data, the estimated type of each component and parameter thereof, the computed variational probability of the latent variable, and the computed free parameter selection variable, and determining whether or not to continue the maximization of the lower bound of the model posterior probability limited in degree of freedom; and outputting the computed variational probability of the latent variable and the estimated type of each component and parameter thereof.

8. The model estimation method according to claim 7, comprising acquiring the variational probability of the latent variable and, for each component, setting variational probabilities of the component to 0 if a sum of the variational probabilities is less than a threshold.

9. The model estimation method according to claim 7, wherein in the case of determining to continue the maximization of the lower bound of the model posterior probability:

the previously estimated type of each component and parameter, the previously computed variational probability of the latent variable and the previously computed free parameter selection variable are acquired, and the variational probability of the latent variable is computed again so as to maximize the lower bound of the model posterior probability;

the previously estimated type of each component and parameter, the previously computed variational probability of the latent variable and the previously computed free parameter selection variable are acquired, and the optimal type of each component and the parameter thereof are estimated again by optimizing the type of each component and the parameter so as to maximize the lower bound of the model posterior probability separated for each component of the latent variable model; and the previously estimated type of each component and parameter and the previously computed variational probability of the latent variable are acquired, and the free parameter selection variable is computed again.

* * * * *